US011564325B2

(12) United States Patent
Chang et al.

(10) Patent No.: US 11,564,325 B2
(45) Date of Patent: Jan. 24, 2023

(54) SYSTEM CHASSIS WITH RAISED SLIDING CHANNEL

(71) Applicant: Quanta Computer Inc., Taoyuan (TW)

(72) Inventors: Chun Chang, Taoyuan (TW); Wei-Pin Chen, Taoyuan (TW); Ta-Wei Chen, Taoyuan (TW); Chin-Tien Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 2 days.

(21) Appl. No.: 17/196,025

(22) Filed: Mar. 9, 2021

(65) Prior Publication Data
US 2022/0295660 A1 Sep. 15, 2022

(51) Int. Cl.
*H05K 7/14* (2006.01)
(52) U.S. Cl.
CPC .................. *H05K 7/1488* (2013.01)
(58) Field of Classification Search
CPC .................................................. H05K 7/1488
See application file for complete search history.

(56) References Cited

U.S. PATENT DOCUMENTS

| 10,750,632 | B1* | 8/2020 | Conroy | H05K 7/1489 |
|---|---|---|---|---|
| 2004/0188362 | A1* | 9/2004 | Liu | H05K 7/1421 |
| | | | | 211/26 |
| 2005/0257232 | A1* | 11/2005 | Hidaka | G11B 33/126 |
| 2009/0244842 | A1* | 10/2009 | Iwakiri | H05K 7/20727 |
| | | | | 361/695 |
| 2015/0181753 | A1* | 6/2015 | Murakami | H05K 7/1489 |
| | | | | 211/162 |
| 2015/0208543 | A1* | 7/2015 | Chen | H05K 7/1489 |
| | | | | 361/679.39 |
| 2016/0029506 | A1* | 1/2016 | Franklin | H05K 5/0021 |
| | | | | 211/26 |

* cited by examiner

*Primary Examiner* — James Wu
*Assistant Examiner* — Christopher L Augustin
(74) *Attorney, Agent, or Firm* — Nixon Peabody LLP

(57) ABSTRACT

A system chassis includes a bottom panel, a first sidewall, and a second sidewall. The bottom panel defines a width of the system chassis. The first sidewall extends substantially vertically from a first end of the bottom panel. The first sidewall includes a first channel vertically offset from the bottom panel. The first channel is configured to mate with a first rail of an equipment rack. The second sidewall extends substantially vertically from a second end of the bottom panel, and is opposite to the first sidewall. The second sidewall includes a second channel configured to mate with an opposing rail of the equipment rack.

20 Claims, 6 Drawing Sheets

SYSTEM CHASSIS WITH RAISED SLIDING CHANNEL

TECHNICAL FIELD

This disclosure relates generally to computer system chassis, and more particularly, to computer system chassis with greater available internal space.

BACKGROUND

The emergence of the cloud for computing applications has increased the demand for off-site installations, known as data centers, which store data and run applications accessed by remotely connected computer device users. Such data centers typically have massive numbers of servers, switches, and storage devices to store and manage data. A typical data center has physical rack structures with attendant power and communication connections. The racks are arranged in rows throughout the room or rooms of the data center. Each rack includes a frame that has vertically oriented slots or chassis between two side walls. The slots may hold multiple network devices such as servers, switches, and storage devices. There are many such network devices stacked in such rack structures found in a modern data center. For example, some data centers have tens of thousands of servers, attendant storage devices, and network switches.

Typically, a traditional server chassis is coupled to a pair of sliding rails at the bottom portion of the server chassis. For example, FIG. 1 depicts a top perspective view of a prior art server chassis 10. The server chassis 10 includes a bottom panel 12, a first side panel 14, and a second side panel 16. The first side panel 14 includes a first recess 24 extending along the length of the first side panel 14, and a first lip 25 protruding from the first recess 24. The second side panel 16 includes a second recess 26 extending along the length of the second side panel 16, and a second lip 27 protruding from the second recess 26. A motherboard 50 is installed on the bottom panel 12 of the server chassis 10. Thus, the server chassis 10 can accommodate a motherboard that has a width up to the width 18 of the bottom panel 12.

FIG. 2 shows a front view of the server chassis 10 installed in a server rack 30. The server rack 30 has a first rack wall 34, and an opposing second rack wall 36. A first slide rail 44 is supported by the first rack wall 34, while a second slide rail 46 is supported by the second rack wall 36 at a position parallel to the first slide rail 44. The first slide rail 44 fits within the first recess 24 (FIG. 1), and the second side rail 46 fits within the second recess 26 (FIG. 1), thereby allowing the server chassis 10 to be mounted in the server rack 30. In order to accommodate the first slide rail 44 and the second slide rail 46, the width 18 of the bottom panel 12 of the server chassis 10 must be less than the width 38 of the space between the first rack wall 34 and the second rack wall 36 of the server rack 30.

A need exists for more efficient utilization of chassis space, which would in turn allow faster computing performance as more components may be inserted in the chassis space. The present disclosure is directed to solving these problems.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

According to some implementations of the present disclosure, a system chassis includes a bottom panel, a first sidewall, and a second sidewall. The bottom panel defines a width of the system chassis. The first sidewall extends substantially vertically from a first end of the bottom panel. The first sidewall includes a first channel vertically offset from the bottom panel. The first channel is configured to mate with a first rail of an equipment rack. The second sidewall extends substantially vertically from a second end of the bottom panel, and is opposite to the first sidewall. The second sidewall includes a second channel configured to mate with an opposing rail of the equipment rack.

In some implementations, the first sidewall defines a height of the system chassis. In some implementations, the first sidewall has a height of about two rack units. In some implementations, the first sidewall has a height of about 84.2 mm. In some implementations, the first channel of the first sidewall is about 22 mm vertically offset from the bottom panel of the system chassis. In some implementations, the first channel of the first sidewall is recessed about 5 mm relative to the first end of the bottom panel of the system chassis. In some implementations, the second channel of the second sidewall is vertically offset from the bottom panel of the system chassis. In some implementations, the system chassis is configured to slide into the equipment rack via the first channel and the second channel.

According to some implementations of the present disclosure, an electronic system includes a first system chassis and an equipment rack. The first system chassis includes a bottom panel, a first sidewall, and a second sidewall. The bottom panel of the first system chassis defines a width of the first system chassis. The first sidewall of the first system chassis extends substantially vertically from a first end of the bottom panel of the first system chassis. The first sidewall of the first system chassis includes a first channel vertically offset from the bottom panel of the first system chassis. The second sidewall of the first system chassis extends substantially vertically from a second end of the bottom panel of the first system chassis. The second sidewall of the first system chassis is opposite to the first sidewall of the first system chassis. The second sidewall of the first system chassis includes a second channel vertically offset from the bottom panel of the first system chassis. The equipment rack has a first pair of opposing rails at a first height. The first pair of opposing rails is configured to support the first system chassis via the first channel and the second channel of the first system chassis.

In some implementations, the first sidewall and the second sidewall of the first system chassis define a height of the first system chassis. In some implementations, the height of the first system chassis is about two rack units. In some implementations, each of the first sidewall and the second sidewall of the first system chassis has a height of about 84.2 mm.

In some implementations, the first channel and the second channel of the first system chassis are about 22 mm vertically offset from the bottom panel of the first system chassis. In some implementations, the first channel of the first system chassis is recessed about 5 mm relative to the first end of the bottom panel of the first system chassis, and the second channel of the first system chassis is recessed about 5 mm relative to the second end of the bottom panel of the first system chassis.

In some implementations, the electronic system further includes a motherboard positioned on the bottom panel of the first system chassis. In some implementations, the motherboard has a width of about the same as the width of the first system chassis.

In some implementations, the electronic system further includes a second system chassis and a second pair of opposing rails. The second system chassis includes a bottom panel, which defines a bottom width of the second system chassis. The second pair of opposing rails is coupled to the equipment rack at a second height. The second pair of opposing rails is configured to support the second system chassis. In some implementations, the bottom width of the second system chassis is less than the width of the first system chassis. In some implementations, the bottom width of the second system chassis is equal to the width of the first system chassis. In some implementations, the first system chassis and the second system chassis are identical.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The foregoing and other advantages of the present disclosure will become apparent upon reading the following detailed description and upon reference to the drawings.

Figure 1:
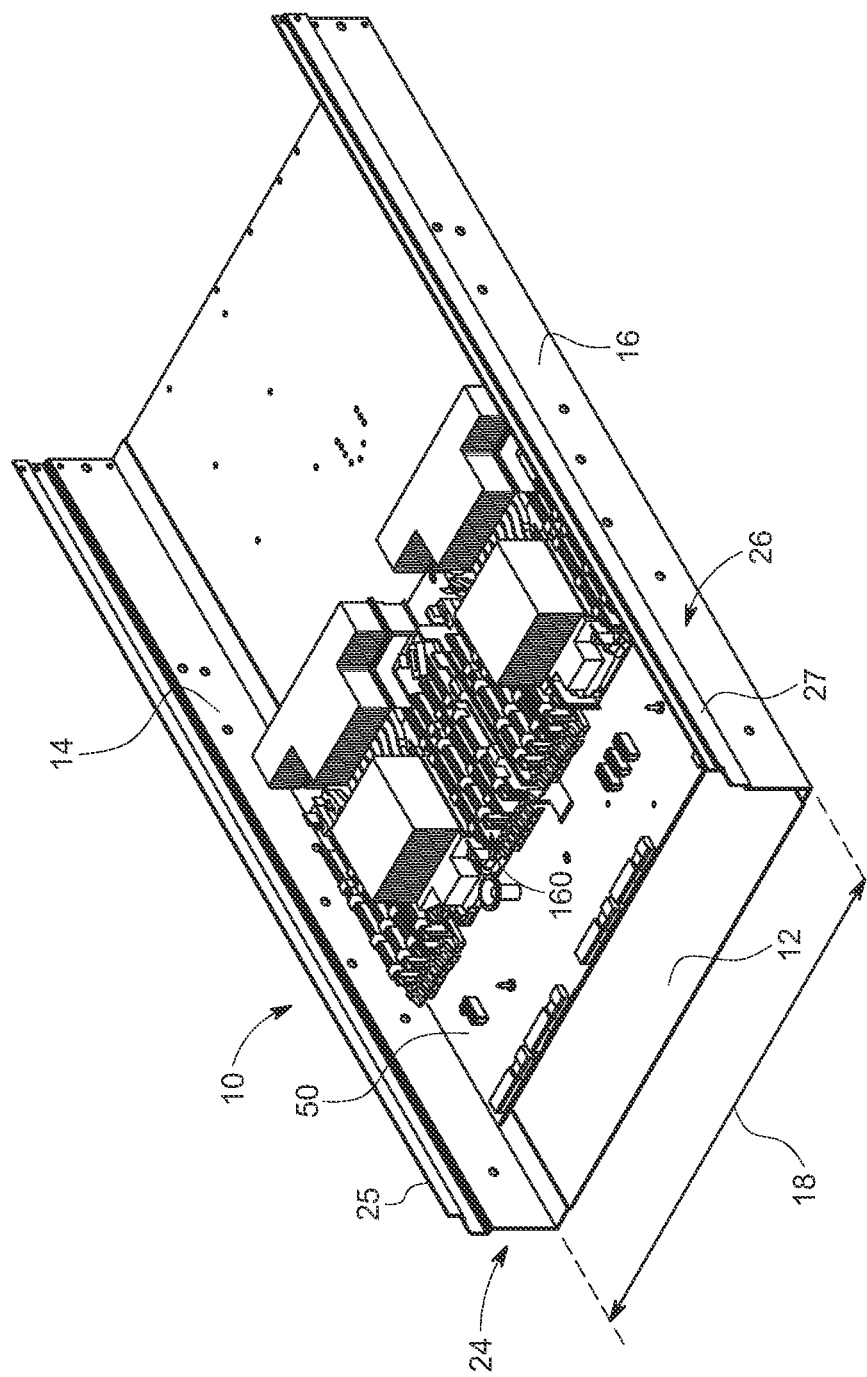
FIG. 1 depicts a top perspective view of a prior art server chassis.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure is described with reference to the attached figures, where like reference numerals are used throughout the figures to designate similar or equivalent elements. The figures are not drawn to scale and are provided merely to illustrate the instant disclosure. Several aspects of the disclosure are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of" or "within acceptable manufacturing tolerances," or any logical combination thereof, for example.

With regards to the present disclosure, the terms "computing device" or "computing system" or "computer system" or "computer" refer to any electronically-powered or battery-powered equipment that has hardware, software, and/or firmware components, where the software and/or firmware components can be configured for operating features on the device.

The present disclosure relates to system chassis with raised channels relative to the bottom panel of the system chassis. For example, when implemented as a server chassis, the system chassis of the present disclosure can accommodate a wider motherboard and/or more cable routing space, compared to a traditional server chassis of similar size.

Figure 3:
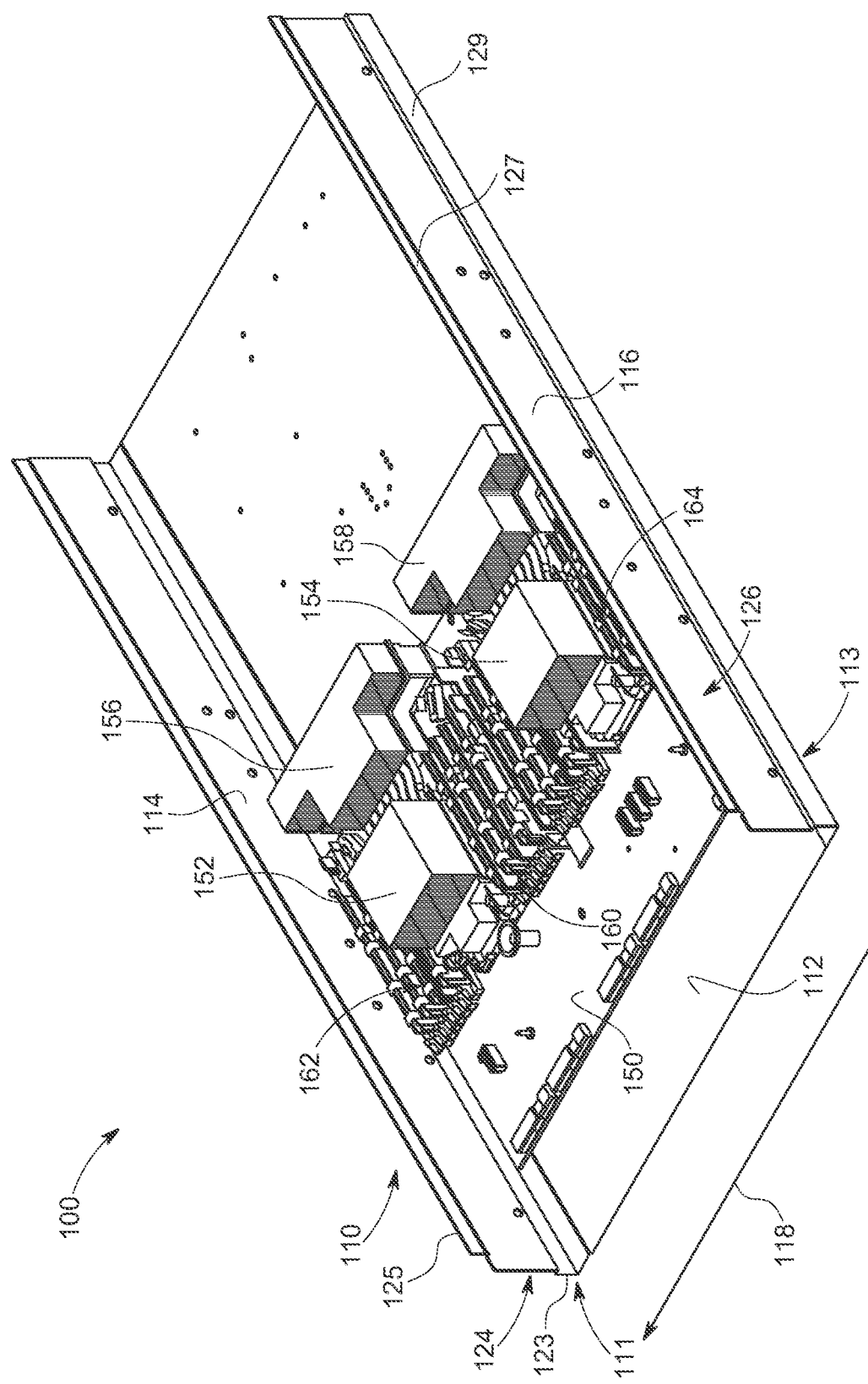
FIG. 3 depicts a top perspective view of a system chassis, according to some implementations of the present disclosure.

Referring to FIG. 3, a top perspective view of an electronic system 100 is depicted, according to some implementations of the present disclosure. For example, the electronic system 100 may be a server, a storage device, a router, a switch, etc. The electronic system 100 includes a system chassis 110, which has a bottom panel 112, a first sidewall 114, and a second sidewall 116. The bottom panel 112 defines the width (represented by a line 118) of the system chassis 110.

The first sidewall 114 extends substantially vertically from a first end 111 of the bottom panel 112. The first sidewall 114 includes a first channel 124 vertically offset from the bottom panel 112. In some implementations, the first sidewall 114 includes a first upper lip 125 above the first channel 124, and a first lower lip 123 below the first channel 124. The first upper lip 125 and the first lower lip 123 protrude outwards (e.g., towards the exterior surface of the first sidewall 114, and away from the interior components of the electronic system 100) relative to the first channel 124.

The second sidewall 116 extends substantially vertically from a second end 113 of the bottom panel, and is opposite to the first sidewall 114. The second sidewall 116 includes a second channel 126 vertically offset from the bottom panel 112. In some implementations, the second sidewall 116 includes a second upper lip 127 above the second channel 126, and a second lower lip 129 below the second channel 126. In some implementations, the second sidewall 116 is a mirror image of the first sidewall 114. The second upper lip 127 and the second lower lip 129 protrude outwards (e.g., towards the exterior surface of the second sidewall 116, and away from the interior components of the electronic system 100) relative to the second channel 126.

In some implementations, the electronic system 100 includes a motherboard 150 positioned on the bottom panel 112 of the system chassis 110. In this example, the electronic system 100 may be a server that includes a first central processing unit ("CPU") underneath a first heat sink 152 and a second CPU underneath a second heat sink 154. A first plurality of dual in-line memory modules ("DIMMs") 160 is installed between the first heat sink 152 and the second heat sink 154. A second plurality of DIMMs 162 is installed between the first heat sink 152 and the first sidewall 114. A third plurality of DIMMs 164 is installed between the second heat sink 154 and the second sidewall 116. In some implementations, the electronic system 100 further includes a first power supply unit ("PSU") 156 and a second PSU 158.

Figure 4:
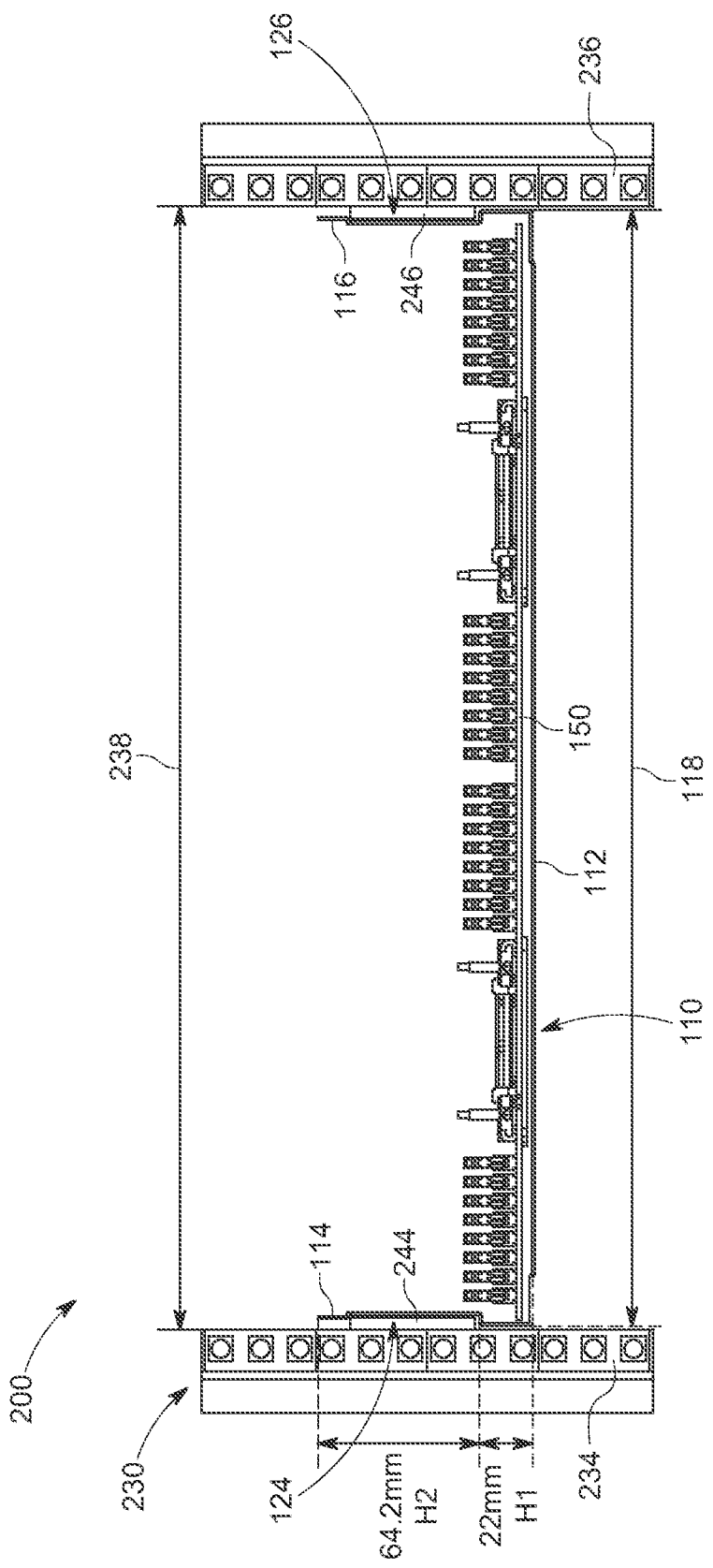
FIG. 4 depicts a front view of the system chassis of FIG. 3 installed in an equipment rack, according to some implementations of the present disclosure.

Referring to FIG. 4, a front view of the system chassis 110 installed in an equipment rack 230 is depicted, according to some implementations of the present disclosure. A multiple component system 200 includes the equipment rack 230 and the system chassis 110. The equipment rack 230 may hold multiple electronic systems having a chassis similar to the system chassis 110 or other chassis of different dimensions. For example, the equipment rack 230 may hold sixteen devices, each device with a chassis similar to the system chassis 110. The equipment rack 230 includes a first rack wall 234, and an opposing second rack wall 236. The first channel 124 of the system chassis 110 is configured to mate with a first rail 244 of the equipment rack 230. The second channel 126 of the system chassis 110 is configured to mate with an opposing second rail 246 of the equipment rack 230. In some implementations, the system chassis 110 is configured to slide into the equipment rack 230 via the first rail 244 and the second rail 246. Other rails may be supported at other heights of the sidewalls 114 and 116 to allow the installation of other components.

The feature of having the first channel 124 and the second channel 126 of the system chassis 110 offset (e.g., raised) from the bottom panel 112 enables provision of additional space to accommodate the first rail 244 and the second rail 246, and does not affect the width of the bottom panel 112. Thus, the width 118 of the bottom panel 112 of the system chassis 110 can take up to the width of the space between the first rack wall 234 and the second rack wall 236 of the equipment rack 230 as represented by a line 238. As such, because the motherboard 150 is positioned on the bottom panel 112 of the system chassis 110, the system chassis 110 can accommodate any motherboard up to the width represented by the line 118 of the bottom panel 112, and therefore up to the width represented by the line 238 of the space between the first rack wall 234 and the second rack wall 236.

In some implementations, the first sidewall 114 and/or the second sidewall 116 of the system chassis 110 defines a height of the system chassis. In this example, the height of the system chassis 110 is about two standard rack units. In some implementations, the first sidewall 114 and/or the second sidewall 116 has a height of about 84.2 mm (i.e., H1+H2). In some implementations, the first channel 124 of the first sidewall 114 is about 22 mm (i.e., H1) vertically offset from the bottom panel 112 of the system chassis 110. Additionally or alternatively, in some implementations, the second channel 126 of the second sidewall 116 is about 22 mm vertically offset from the bottom panel 112 of the system chassis 110.

Figure 2:
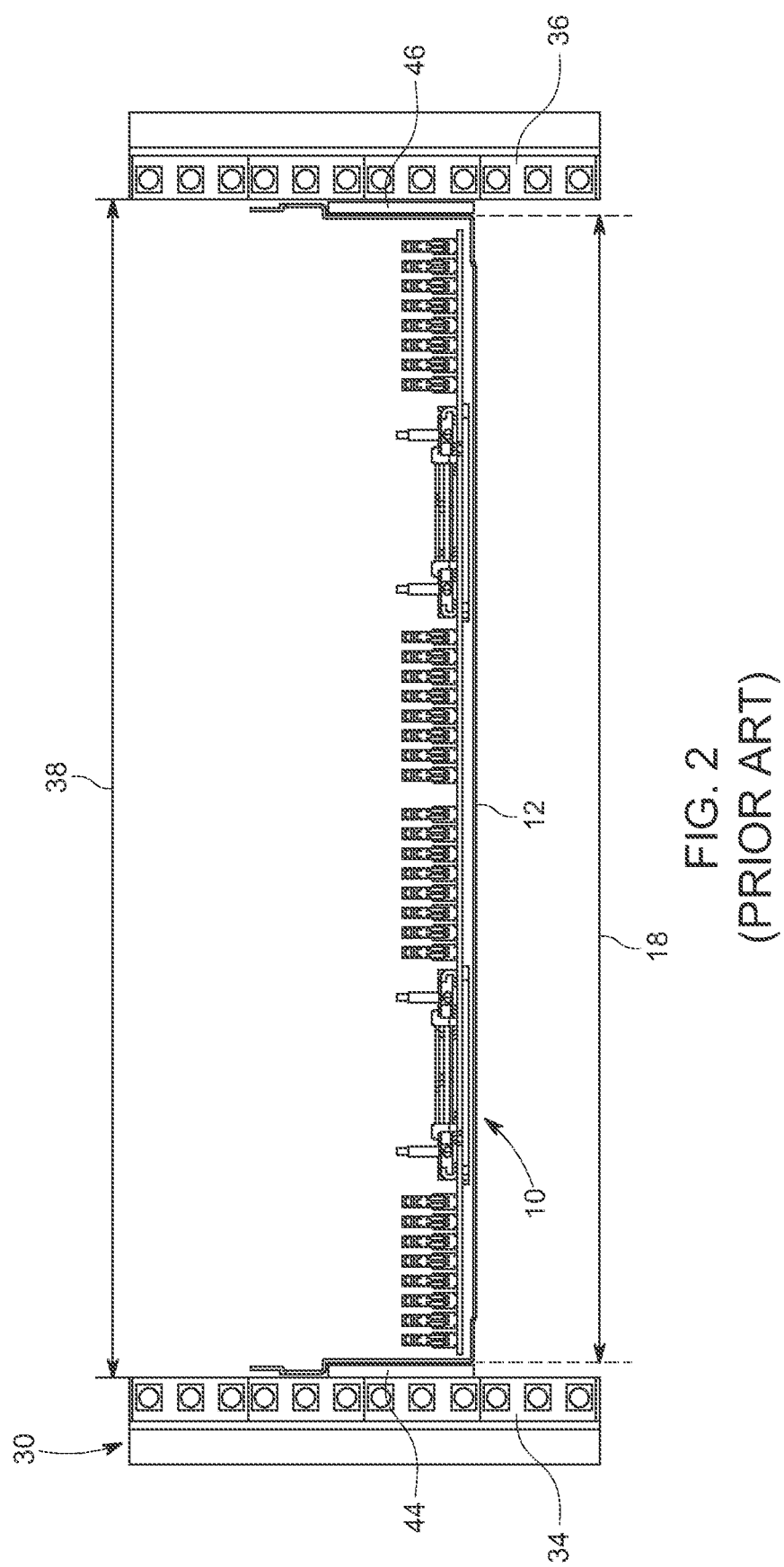
FIG. 2 depicts a front view of the prior art server chassis of FIG. 1 installed in a server rack.
Figure 5:
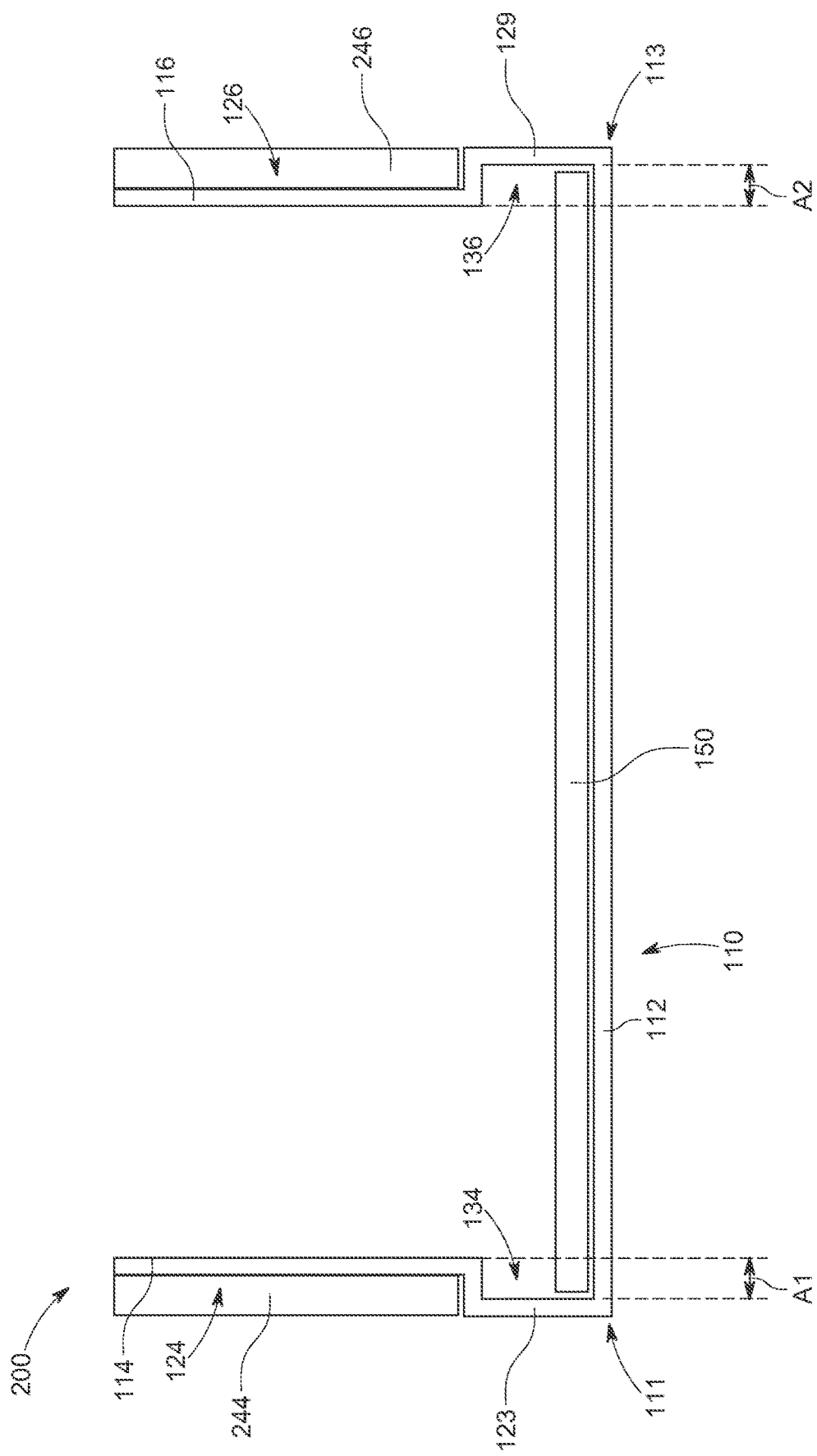
FIG. 5 depicts a front schematic view of the system chassis of FIG. 3, according to some implementations of the present disclosure.

Compared to the traditional server chassis (e.g., the server chassis 10 in FIGS. 1-2), the system chassis 110 dimensioned for the same equipment rack 230 can accommodate a larger motherboard because of efficient space allocation due to the raised channels 124, 126 over the motherboard 150. Referring to FIG. 5, a front schematic view of the system chassis 110 is depicted, according to some implementations of the present disclosure. For example, in some implementations, the first channel 124 of the first sidewall 114 is recessed (e.g., laterally offset) about 5 mm (i.e., A1) relative to the first end 111 of the bottom panel 112 of the system chassis 110. Additionally or alternatively, in some implementations, the second channel 126 of the second sidewall 116 is recessed (e.g., laterally offset) about 5 mm (i.e., A2) relative to the second end 113 of the bottom panel 112 of the system chassis 110.

Generally, an individual rack, such as the equipment rack 230 (FIG. 4), has components such as a power supply, and physical components to hold the networked devices in the slots defined by rails (e.g., the first rail 244 and the second rail 246). Network devices require cable connections to a switch or router that may be typically mounted in the top or bottom slots for maximum ease of cabling. Since there are extensive cables to connect the network devices in a rack, additional space within the system chassis of each network device can be advantageous in efficient routing.

Thus, still referring to FIG. 5, for the system chassis 110, in some implementations, the profile difference between the first channel 124 and the first lower lip 123 of the first sidewall 114 provides a first interior pocket 134. Similarly, the profile difference between the second channel 126 and the second lower lip 129 of the second sidewall 116 provides a second interior pocket 136. The first interior pocket 134 and/or the second interior pocket 136 provides additional space above the motherboard 150, which is available to accommodate additional components for the multiple component system 200, such as additional cables, connectors, VR components, or capacitors. Furthermore, compared to the traditional server chassis, the system chassis 110 has a lower center of gravity, so that the system chassis 110 has better structural stability.

Figure 6:
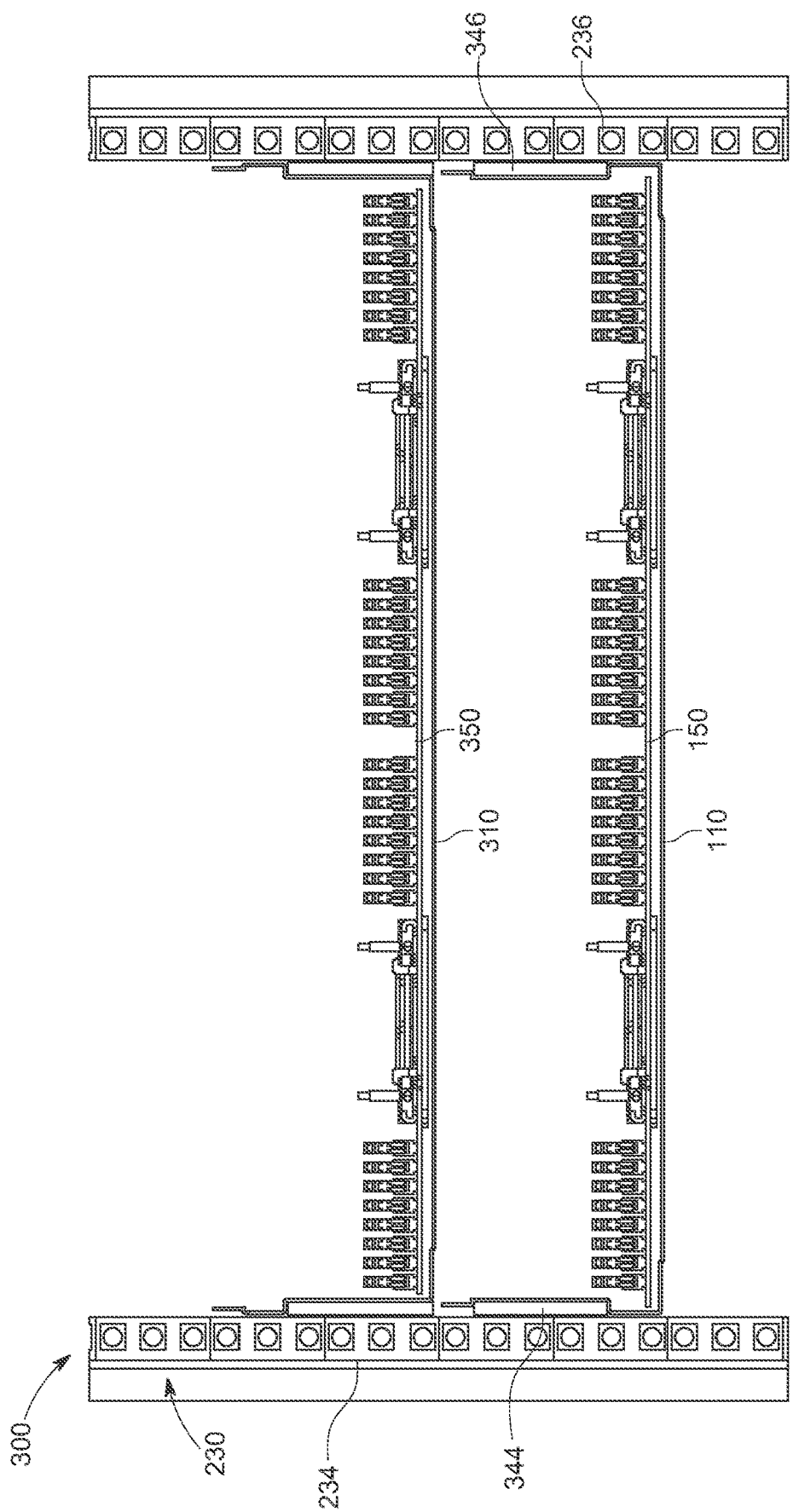
FIG. 6 depicts a front view of the system chassis of FIG. 3 installed in an equipment rack having an existing server chassis, according to some implementations of the present disclosure.

In some implementations, the system chassis 110 may be used in an equipment rack that already has an existing system chassis that is the same as, or different from, the system chassis 110. For example, FIG. 6 depicts a front view of the system chassis 110 installed in the equipment rack 230 having an existing server chassis 310, according to some implementations of the present disclosure.

The multiple component system 300 includes the equipment rack 230 that is the same as, or similar to, the equipment rack 230 in FIG. 4. The multiple component system 300 further includes a first pair of opposing rails 344 and 346 coupled to the equipment rack 230 at a first height. The first pair of opposing rails 344 and 346 is configured to support the system chassis 110, which is the same as, or similar to, the system chassis 110 in FIGS. 3-5.

In some implementations, the system chassis 110 is installed above the existing server chassis 310 of the multiple component system 300. In some such implementations, the existing server chassis 310 is the same as, or similar to, the server chassis 10 in FIG. 1. As shown in FIG. 6, the system chassis 110 can accommodate the motherboard 150 that is wider than the motherboard 350 of the existing server chassis 310. Thus, the system chassis 110 may be introduced to older electronic systems that still employ traditional server chassis. In some other implementations, an electronic system may include an equipment rack that only has system chassis that is the same as, or similar to, the system chassis 110 in FIG. 3.

While the example systems 100, 200, and 300 include the system chassis 110, the vertically offset (e.g., raised) channels (e.g., 124 and 126 in FIG. 3) may be built into any chassis for any electronic system. Such electronic systems may include, for example, any type of server, storage devices, network switches, communications equipment, and the like.

One or more elements or aspects or steps, or any portion(s) thereof, from one or more of any of claims 1-20 below can be combined with one or more elements or aspects or steps, or any portion(s) thereof, from one or more of any of the other claims 1-20 or combinations thereof, to form one or more additional implementations and/or claims of the present disclosure.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system chassis comprising:
    a bottom panel defining an interior width of the system chassis;
    a first sidewall extending substantially vertically from a first end of the bottom panel, the first sidewall including a first channel vertically offset from the bottom panel, the first channel configured to mate with a first rail of an equipment rack; and
    a second sidewall extending substantially vertically from a second end of the bottom panel and opposite to the first sidewall, the second sidewall including a second channel configured to mate with an opposing rail of the equipment rack;
    wherein the first end of the bottom panel joining the first sidewall defines a first interior edge of the bottom panel, an interior surface of the first channel of the first sidewall is recessed relative to the first interior edge of the bottom panel.

2. The system chassis of claim 1, wherein the first sidewall defines a height of the system chassis.

3. The system chassis of claim 1, wherein the first sidewall has a height of about two rack units.

4. The system chassis of claim 1, wherein the first sidewall has a height of about 84.2 mm.

5. The system chassis of claim 1, wherein the first channel of the first sidewall is about 22 mm vertically offset from the bottom panel of the system chassis.

6. The system chassis of claim 1, wherein the interior surface of the first channel of the first sidewall is recessed about 5 mm relative to the first interior edge of the bottom panel of the system chassis.

7. The system chassis of claim 1, wherein the second channel of the second sidewall is vertically offset from the bottom panel of the system chassis.

8. The system chassis of claim 1, wherein the system chassis is configured to slide into the equipment rack via the first channel and the second channel.

9. An electronic system comprising:
    a first system chassis including:
        a bottom panel defining an interior width of the first system chassis;
        a first sidewall extending substantially vertically from a first end of the bottom panel, the first sidewall including a first channel vertically offset from the bottom panel; and
        a second sidewall extending substantially vertically from a second end of the bottom panel and opposite to the first sidewall, the second sidewall including a second channel vertically offset from the bottom panel;
        wherein the first end of the bottom panel joining the first sidewall defines a first interior edge of the bottom panel, an interior surface of the first channel of the first sidewall is recessed relative to the first interior edge of the bottom panel;
        wherein the second end of the bottom panel joining the second sidewall defines a second interior edge of the bottom panel, an interior surface of the second channel of the second sidewall is recessed relative to the second interior edge of the bottom panel; and
    an equipment rack having a first pair of opposing rails at a first height, the first pair of opposing rails configured to support the first system chassis via the first channel and the second channel of the first system chassis.

10. The electronic system of claim 9, wherein the first sidewall and the second sidewall define a height of the first system chassis.

11. The electronic system of claim 10, wherein the height of the first system chassis is about two rack units.

12. The electronic system of claim 9, wherein each of the first sidewall and the second sidewall of the first system chassis has a height of about 84.2 mm.

13. The electronic system of claim 9, wherein the first channel and the second channel of the first system chassis are about 22 mm vertically offset from the bottom panel of the first system chassis.

14. The electronic system of claim 9, wherein the interior surface of the first channel of the first system chassis is recessed about 5 mm relative to the first interior edge of the bottom panel of the first system chassis, and the interior surface of the second channel of the first system chassis is recessed about 5 mm relative to the second interior edge of the bottom panel of the first system chassis.

15. The electronic system of claim 9, further comprising a motherboard positioned on the bottom panel of the first system chassis.

16. The electronic system of claim 15, wherein the motherboard has a width of about the same as the interior width of the first system chassis.

17. The electronic system of claim 9, further comprising:
a second system chassis including a bottom panel defining an interior width of the second system chassis; and
a second pair of opposing rails coupled to the equipment rack at a second height, the second pair of opposing rails configured to support the second system chassis.

18. The electronic system of claim 17, wherein the interior width of the second system chassis is less than the interior width of the first system chassis.

19. The electronic system of claim 17, wherein the interior width of the second system chassis is equal to the interior width of the first system chassis.

20. The electronic system of claim 19, wherein the first system chassis and the second system chassis are identical.

* * * * *